United States Patent [19]

Middelhoek et al.

[11] Patent Number: 5,216,269

[45] Date of Patent: Jun. 1, 1993

[54] ELECTRICALLY-PROGRAMMABLE SEMICONDUCTOR MEMORIES WITH BURIED INJECTOR REGION

[75] Inventors: Jan Middelhoek, Hengelo; Gerrit-Jan Hemink, Enschede; Rutger C. M. Wijburg, Hengelo; Louis Praamsma, Nijmegen; Roger Cuppens, Eindhoven, all of Netherlands

[73] Assignee: U.S. Philips Corp., New York, N.Y.

[21] Appl. No.: 745,992

[22] Filed: Aug. 8, 1991

Related U.S. Application Data

[63] Continuation of Ser. No. 503,350, Mar. 30, 1990, abandoned.

[30] Foreign Application Priority Data

Mar. 31, 1989 [GB] United Kingdom ............ 8907262
Sep. 22, 1989 [GB] United Kingdom ............ 8921445

[51] Int. Cl.$^5$ .................................. H01L 29/788
[52] U.S. Cl. ..................................... 257/318; 257/320
[58] Field of Search .......... 357/23.5, 13, 13 PT; 365/185; 257/316, 318, 319, 320, 321

[56] References Cited

U.S. PATENT DOCUMENTS

| | | | |
|---|---|---|---|
| 3,893,151 | 7/1975 | Bosselaar et al. | 357/23.5 |
| 4,010,482 | 3/1977 | Abbas et al. | 357/23.5 |
| 4,037,242 | 7/1977 | Gosney | 357/23.5 |
| 4,163,985 | 8/1979 | Schuermeyer et al. | 357/23.5 |
| 4,432,075 | 4/1984 | Eitan | 357/23.5 |
| 4,462,090 | 6/1984 | Iizuka | 365/185 |
| 4,821,236 | 4/1989 | Hayashi et al. | 357/23.5 |

FOREIGN PATENT DOCUMENTS

| | | | |
|---|---|---|---|
| 00214477 | 10/1984 | German Democratic Rep. | 357/23.5 |
| 53-87674 | 2/1978 | Japan | 357/23.5 |
| 54-39581 | 3/1979 | Japan | 357/23.5 |
| 54-99531 | 8/1979 | Japan | 357/23.5 |
| 54-156484 | 10/1979 | Japan | 357/23.5 |
| 63-172471 | 7/1988 | Japan | 357/23.5 |

OTHER PUBLICATIONS

IEEE Transactions on Electron Devices, vol. ED-24, No. 5, May 1977, "Avalanche Injection and near Avalanche Injection of Charge Carriers into $SiO_2$", by Verwey et al.

*Primary Examiner*—Rolf Hille
*Assistant Examiner*—Steven Loke
*Attorney, Agent, or Firm*—Steven R. Biren

[57] ABSTRACT

Each memory cell of an electrically-programmable semiconductor memory has a field-effect transistor with a charge-storage region. Efficient and fast injection of hot carriers into the charge-storage region is achieved by vertical punch-through of a depletion layer to a buried injector region, by application of programming voltages to a control gate and to the surface of the punch-through region. Non-injected carriers are removed via at least the transistor drain during the programming. A well-defined punch-through region can be obtained with a higher-doped boundary region at at least one side of the punch-through region to restrict the lateral spread of the depletion layer(s) and prevent parasitic connections. This permits closer spacing of the injector region to other regions of the memory cell, e.g. source and drain regions, and the injector region may adjoin an inset insulating field pattern. A compact cell array layout can be formed with a common connection region for the injector regions of two adjacent cells and for either a source or drain region of four other adjacent cells. The control gate and an erase gate may both be coupled in the same manner to the charge-storage region, and the cell can be operated with complementary voltage levels for writing and erasing. A feed-back mechanism with the start of injection from the punch-through and injector regions can provide a well-defined charge level limit for the erasure.

19 Claims, 3 Drawing Sheets

ELECTRICALLY-PROGRAMMABLE SEMICONDUCTOR MEMORIES WITH BURIED INJECTOR REGION

This is a continuation of application Ser. No. 07/503,350, filed Mar. 30, 1990 now abandoned.

BACKGROUND OF THE INVENTION

This invention relates to electrically-programmable semiconductor memories comprising a plurality of memory cells each having a charge-storage region (for example, a floating gate) whole charge state defines a memory state of the cell. The memories may be, for example, EEPROMs (electrically-erasable programmable read-only memories) or more simple EPROMs (electrically programmable read only memories) of various forms.

United Kingdom patent specification GB-A-1 425 985 describes electrically-programmable semiconductor memories comprising a plurality of memory cells, each cell having a field-effect transistor and a charge-storage region whose charge state defines a memory state of the cell. The known devices comprise a semiconductor body having for each cell a first insulating layer portion present at a major surface of the body over a first region of the body of a first conductivity type, the charge-storage region extending at a surface of the first insulating layer portion. There are programming means for each cell comprising an injector region of the opposite second conductivity type forming a p-n junction with the first region, and a control gate capacitively coupled to the charge-storage region.

Various forms of EPROMs are known using different injection mechanisms to inject charge-carriers (and especially hot electrons) into the first insulating layer portion to set the charge-state of the charge-storage region. In most currently used EPROM designs hot electrons are generated either by subjecting the drain or source of a MOS (insulated-gate field-effect) transistor with a floating gate to an avalanche breakdown or by applying sufficiently high fields to the transistor so that the hot electrons are generated in the channel itself. However, in these cases the electrons are most generally accelerated parallel to the surface of the body and so need to be redirected towards the surface to achieve more efficient injection into the charge-storage region. Furthermore, the doping profiles of the source and/or drain are adapted so as to generate sufficient hot electrons at reasonable voltage levels, and this may result in using a different MOS transistor process technology for the memory cells compared with what is desired for other parts of an integrated circuit device. If, for programming, hot electrons are used in the channel of the memory transistor, the source and drain geometries and/or doping may be optimized for this purpose in different ways, the read and write voltages being applied to different terminals of the memory transistor. Channel lengths shorter than those normally desired may be needed to program at low voltages. Alternatively, the memory cell may comprise two transistors of which the first transistor is used during reading and the second transistor is used during writing. This two-transistor arrangement may occupy a large space for the memory cell.

Another type of injector is known in which the hot electrons are generated by forward-biasing a diode. This diode may be inserted below the memory transistor, for example as described in GB-A-1 425 985. This form has several advantages including the possibility of using the same transistor process technology for the memory transistors as for other transistors in the circuit. However, it is necessary to generate a negative diode voltage in the circuit, and the diode also injects the electrons in all directions (including into the substrate) so that large substrate currents may be dissipated.

SUMMARY OF THE INVENTION

According to the present invention, there is provided an electrically-programmable semiconductor memory comprising a plurality of memory cells, each cell having a field-effect transistor with a charge-storage region whose charge state defines a memory state of the cell, the memory comprising a semiconductor body having for each cell a first insulating layer portion present at a surface of the body over a first region of the body of a first conductivity type, the charge-storage region extending at a surface of the first insulating layer portion, and programming means for each cell comprising an injector region of the opposite second conductivity type forming a p-n junction with the first region, and a control gate capacitively coupled to the charge-storage region, which electrically-programmable semiconductor memory is characterized in that the injector region is so located within the body as to be below the first region below the charge-storage region, in that the control gate, the injector region and at least a drain of the transistor of each cell are provided with connection means for applying programming voltages to a cell to bias the control gate and the surface of the first region with respect to the injector region so as to set a desired charge-state of that cell by injection of hot charge-carriers through the first insulating layer portion vertically from the injector region, the first region having a sufficiently low doping concentration of the first conductivity type above the injector region to allow punch-through via a depletion layer vertically across the thickness of the first region to the injector region upon application of the programming voltages and in that hot charge carriers not injected into the first insulating layer portion are removed via the connection means to the drain of the transistor of that cell during the programming of that cell.

In this way, a desired charge-state of the charge-storage region is set by hot carrier injection vertically from the injector region into the charge-storage region. The same device process technology may be used for the memory cells as for other circuit parts, and no bias voltage supply of opposite polarity is required for the injector region. The efficient programming mechanism may be utilized to enable faster programming or to program with currents of lower value. Furthermore, as a result of this efficient programming mechanism, it is possible that fewer charges may be trapped in the insulating layer so that a larger number of erase/write cycles may be carried out before serious degradation of the insulating layer occurs.

It may be noted that published Japanese patent application (Kokai) JP-A-63.172471 discloses a semiconductor memory using punch-through of a depletion layer to a buried region from below a floating-gate charge-storage region on an insulating layer. In this memory, a desired "1" memory state of one or more cells is first written as an isolated (i.e. floating potential) charge-state at the surface of the semiconductor body by applying a low programming voltage to an overlying control gate, of the selected cell(s), after which the memory state is made non-volatile by applying a high voltage to the control gates of all the cells. Depletion-layer punch-through and injection of hot carriers into the charge-storage region only occurs in these cells where the isolated "1" charge-state was previously temporarily written at the semiconductor surface. With an understanding of of the present invention, it can be seen that adoption of the arrangement disclosed in JP-A-63.172471 will not provide efficient injection of hot carriers to the charge-storage region; thus, non-injected carriers are not removed during programming but accumulate at the surface, and the isolated surface potential (determined by the temporarily-written volatile charge-state at the surface) reduces in magnitude during the programming, both of which factors would appear to produce a premature stopping of the injection. The punch-through memory arrangements of JP-A-63.172471 lack the transistor connection means provided in accordance with the present invention to bias the surface of the first region and to remove non-injected charge-carriers during the programming.

The present invention provides a semiconductor memory in which, by a sustained vertical punch-through of a depletion layer below a charge-storage region, hot carriers are generated in a vertical direction from the injector region to the biased surface (and so most already have the right direction to be injected efficiently into the insulating layer portion having the charge-storage region), while non-injected carriers are removed from the biased surface via the connection means to at least the drain of the transistor in accordance with the invention. In this manner a localized and efficient injection can be sustained during the programming stage. By adopting particular arrangements in accordance with the invention, the vertical punch-through can be confined to a desired injection area below part of the charge-storage region and can be achieved in a compact device structure in spite of the injector region and drain connections.

According to one aspect of the present invention there is provided an electrically-programmable semiconductor memory in which the lateral spread of a depletion layer during vertical punch-through to the injector region is restricted by a boundary region. This can facilitate incorporation of the injector in a compact cell structure by reducing the influence of depletion layers in lateral directions associated with other constituent parts of the memory cell. Such a boundary region may comprise an inset insulating layer pattern. However preferably a semiconductor memory device in accordance with the invention is characterized in that at least one boundary region comprises a semiconductor zone having a higher doping concentration of the first conductivity type which is present at at least one side of the low-doped first region of each cell and restricts the lateral spread of the depletion layer at that side during punch-through vertically across the thickness of the low-doped first region. In order to prevent a punch-through connection by the depletion layer of, for example, a transistor source and/or drain region with the injector region in a compact cell structure, at least one higher-doping boundary region may be provided in accordance with the present invention between the injector region and the source and/or drain region. Such a boundary region may laterally separate the transistor area from the punch-through first region above the injector region or, for example, the transistor source and/or drain regions may be formed in one or more boundary regions which may be separated in the channel area. Boundary regions in accordance with the invention may also serve to prevent parasitic connection of the injector region to the surface, for example at a peripheral part of the injector region either adjacent an inset field insulating layer pattern or across an island portion of the memory cell.

According to another aspect of the present invention there is provided an electrically programmable semiconductor memory in which the injector region of one cell has a connection region of the second conductivity type which forms a common connection for different regions of (for example, six) adjacent memory cells. A compact memory array structure can be obtained with only a small number of connections per cell, for example only two shared contact windows in each cell. Thus, each memory cell may comprise an island portion of the body, and the device may be characterized in that the island portions of two adjacent cells adjoin each other at a connection region of the second conductivity type which forms a common connection to the injector regions of the two adjacent cells. This connection region may extend into four other adjacent island portions (in addition to said two adjacent island portions) to form a source or drain connection of a transistor in each of said four island portions.

According to a further aspect of the present invention there is provided an electrically erasable semiconductor memory which is characterized in that each memory cell comprises an erase gate which is coupled to the charge-storage region (e.g. by being present on a second insulating layer over the charge-storage region) to permit electrical erasure of the memory state of that cell by applying an erasure voltage to the erase gate. Such a device structure having both the erase gate and control gate coupled to the charge-storage region (e.g. via the second insulating layer) can be biased so as to form a feed-back loop using hot-carrier injection to prevent over-erasure. Thus, as over-erasure of the charge-storage region is approached, it is compensated by the start of hot-carrier injection through the vertical punch-through region from the injector region below the charge-storage region.

Thus, in accordance with this further aspect of the invention, there is provided an electrically-programmable semiconductor memory comprising a plurality of memory cells each having a charge-storage region whose charge state defines a memory state of the cell, and programming means for each cell comprising an injector region forming a p-n junction with a first region below the charge-storage region, and a control gate capacitively coupled to the charge-storage region, characterized by means for applying programming voltages to bias the control gate and the surface of the first region with respect to the injector region to set a desired charge-state of the charge-storage region by punch-through via a depletion layer across the thickness of the first region to the injector region, thereby setting a desired programmed charge-state by hot carrier injection from the injector region into the charge-storage region, which memory is further characterized by each memory cell comprising an erase gate coupled to the charge-storage region by a capacitive coupling which is less than the capacitive coupling of the control gate to the charge-storage means, and means for applying an erasure voltage to the erase gate to permit electrical erasure of the programmed charge-state of that cell while biasing the control gate at a lower voltage and while biasing the surface of the first region and the injector region at programming voltages and thereby to permit hot carrier injection into the charge-storage region from the injector region to compensate against over-erasure of the memory state.

BRIEF DESCRIPTION OF THE DRAWING

These and other features in accordance with the invention are illustrated, by way of example, in several specific embodiments of the invention now to be described with reference to the accompanying diagrammatic drawings, in which.

Figure 1:
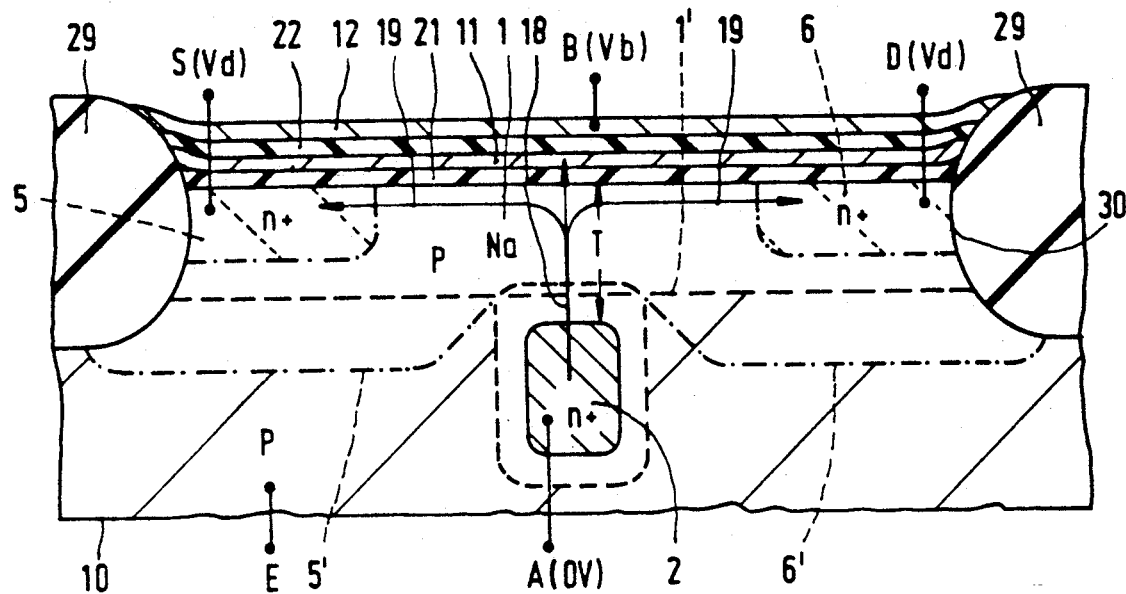
FIG. 1 is a schematic cross-section of part of a memory cell of a semiconductor memory in accordance with the invention.

It should be noted that the drawings are diagrammatic and not drawn to scale. The relative dimensions and proportions of parts of these drawings have been shown exaggerated or reduced in size for the sake of clarity and convenience in the drawings. The same reference signs as used in one embodiment are generally used when referring to corresponding or similar parts in other embodiments. Depletion layers are shown without cross-hatching in FIG. 1, whereas some features which are not in cross-section are hatched in FIGS. 3 to 6 to facilitate visualization.

DESCRIPTION OF THE PREFERRED EMBODIMENTS

FIG. 1 illustrates part of one memory cell of an electrically-programmable semiconductor memory in accordance with the present invention. The memory comprises a plurality of such cells which may be identical to or symmetrical with each other in their layout. Each cell has a field-effect transistor composed of regions 5, 11, 12 with a charge-storage region 11 (preferably in the form of a floating gate, for example of doped polycrystalline silicon) whose charge state defines a memory state of the cell. The memory comprises a semiconductor body 10 (for example of silicon) having for each cell a first insulating layer portion 21 (for example of silicon dioxide) present at a surface of the body 10 over a p type first region 1 of the body 10. The floating gate 11 extends at a surface of the first insulating layer portion 21. Each cell comprises transistor source and drain regions 5 and 6 respectively in at least a part of the first region 1 below the charge-storage region 11. Each cell has programming means comprising an n type injector region 2 present in the body 10 and forming a p-n junction with the first region 1. A control gate 12 (for example of doped polycrystalline silicon) is capacitively coupled to the floating gate 11. This capacitive coupling is preferably achieved by providing the control gate 12 on a second insulating layer portion 22, with the floating gate 11 between the layers 21 and 22.

In accordance with the present invention, the injector region 2 is so located within the body 10 (for example as a buried layer) as to be below the first region 1 below the floating gate 11. This p type first region 1 has a sufficiently low acceptor doping concentration Na at least above the injector region 2 as to allow punch-through via a depletion layer 1' vertically across the thickness T of the first region 1 to the injector region 2 upon application of programming voltages Vb and Vd. There are connections B, (S+D), and A respectively to the control gate 12, the surface of the first region 1 (via the source and drain regions 5 and 6) and the injector region 2 for applying the programming voltages Vb (for example about 15 volts) to bias the control gate 12, and Vd (for example about 5 volts) to bias the surface of the first region 1, with respect to the injector region 2. Thereby a desired charge-state of the floating gate 11 is set (so programming the cell) by hot electron injection vertically from the n type injector region 2 into the floating gate 11. The n type injector region 2 is biased with zero voltage during programming. The surrounding p type body portion may be at 0 volts.

The zero-bias potential barrier (Vo) of the p-n junction between the injector region 2 and the first region 1 is lowered by the punch-through of the depletion layer formed in the region 1 by the voltages Vd and Vb. Where this depletion layer punches through to the narrow zero-bias depletion layer (of width Xo) around the region 2, the p-n junction becomes forward biased, and electrons flow from the n type injector region 2 into the punch-through region 1. These electrons become heated by acceleration in the depletion layer 1' and are directed by the field towards the insulating layer 21, as indicated by arrow 18. A significant proportion of these hot electrons have sufficient energy for entering the insulating layer 21 and drifting therein to the floating gate 11 under the attraction of the positive voltage Vb coupled from the control gate 12. During the programming, the electrons which do not enter the layer 21 are extracted by means of transistor source and drain regions 5 and 6 of the memory cell, as illustrated by arrows 19. These regions 5 and 6 are shown in chain-dot outline in FIG. 1 because they are preferably located out of the drawing plane of FIG. 1, unless they are located in a boundary region 3 as described hereinafter with reference to FIGS. 8 to 10. During the programming, these n type source and drain regions 5 and 6 are held at a positive potential (e.g. 5 volts), and the associated depletion layers 5' and 6' are also shown in chain-dot outline. Because of the continuous channel inversion layer formed in the depletion layer at the p type body surface below the gate structure, the surface of the region 1 is at a potential $Vc = Vd + 2\phi_F$ with Vd applied to the source and drain regions 5 and 6, $\phi_F$ being the potential difference between the Fermi level in the region 1 and the mid-bandgap level. This injector arrangement has several advantages. The injector 2 does not need an extra biasing voltage. The injector 2 is only injecting if the cell is being programmed. The injector 2 is directional in its injection and does not inject into, for example, the underlying substrate so that substrate currents are very small.

When the injector 2 is grounded, it can be seen that punch-through can only take place if both the control gate 12 and the transistor source and drain regions 5 and 6 are raised to a high potential (e.g. 15 volts and 5 volts respectively) so as to maintain the voltage distribution over the punch-through region, thereby allowing injection of the electrons into the floating gate 11. Punch-through is inhibited in all cases if the n type injector 2 is raised to a positive potential (e.g. 5 volts) instead of being grounded, or if the source and drain regions 5 and 6 are at zero volts instead of 5 volts, or if the control gate is at zero volts. Thus, when programming cells in one selected row of a memory matrix, the injectors 2 in non-selected adjacent rows can be inhibited by applying these different voltages. This permits a simple connection scheme as will be illustrated later with reference to FIG. 6.

The minimum voltage Vp required for punch-through depends strongly on the doping level Na and the thickness T of the region 1 between the injector region 2 and the body surface. This punch-through voltage Vp is of the form:

$$Vp + Vo = A.Na.(T - Xo)^2$$

where A is a constant.

Calculations indicate that for a punch-through voltage Vp of 4 volts, the distance T should be about 0.5 micrometers for Na of $5 \times 10^{16}$ cm$^{-3}$ and nearly 0.8 micrometers for Na of $2 \times 10^{16}$ cm$^{-3}$.

By increasing the programming voltage above Vp, the potential barrier of the p-n junction between regions 1 and 2 is lowered, resulting in current flow from the injector region 2 to the punch-through region 1. This punch-through electron current I is of the form.

$$I = Io.\exp((-B.Xo/T)(Vc - Vp))$$

where B is a constant, and Vc is the voltage over the punch-through region.

A high field for heating the electrons is produced in the punch-through depletion layer 1'. In order to obtain a high injection efficiency, the accelerating field in the depletion layer must be higher than the barrier between the semiconductor body 10 and the first insulating layer 21 (i.e. about 3.2 volts for the barrier between silicon and silicon dioxide). Thus, this can be achieved by biasing the source and drain regions 5 and 6 from a conventional 5 volt supply. The control gate 12 needs a higher voltage Vb sufficient to maintain the transistor in the on state during programming. The magnitude Vb depends on the magnitude of the capacitive coupling and must be sufficient to maintain the inversion layer (in the depletion layer) at the body surface even in a higher-doped boundary region 3 (see below) between the transistor channel area and the punch-through region 1. Typically Vb may be between, for example, 15 to 20 volts. Because the control gate 12 draws only a small current, this high voltage Vb can be generated in simple fashion with a charge pump from a 5 volt supply.

Figure 2:
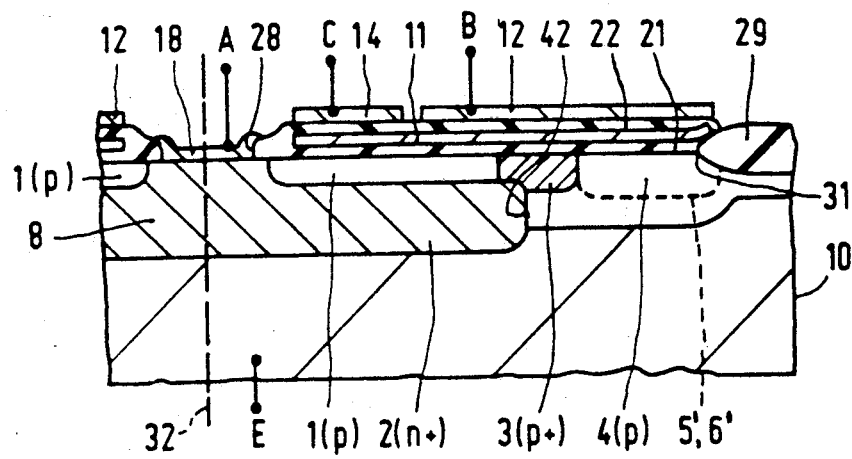
FIG. 2 is a cross-sectional view (perpendicular to that of FIG. 1) of a particular memory cell structure in accordance with the invention.

Preferably, to facilitate manufacture of the device, the same doping level Na is present in the punch-through first region 1 as in the transistor area 4 of the cell (at least down to the same depth T). Thus, for example, the injector region 2 may comprise an implanted n type well in a p type portion (substrate) of the body 10, and a shallower implanted p type well formed in a laterally adjacent part of the p type portion may overlap and overdope part of the area of n type well to form the punch-through first region 1 above the injector region 2. Such a cell structure is illustrated in FIG. 2. The doping level Na therefore influences many parameters of the memory cell: (1) the floating gate voltage to allow injection of electrons over the silicon to silicon dioxide barrier; this voltage is a minimum for Na of about $2 \times 10^{16}$ to $5 \times 10^{16}$ cm$^{-3}$; (2) the source/drain voltage (to overcome the same barrier) decreases with increasing Na and is below 5 volts for Na of greater than $1 \times 10^{16}$ cm$^{-3}$; (3) the injection probability which increases for increasing Na; (4) the threshold voltage of a not-programmed cell increases with increasing Na, but this is also related to the threshold voltage for n channel MOS transistors formed with the same processing in other parts of the circuit; and (5) the punch-through voltage Vp which increases with increasing Na, although it can also be changed by changing the depth T at which the injector 2 is located.

Considering these various parameters, it can be seen that a high value of Na is favorable for high programming rates, but that Na should not exceed about $5 \times 10^{16}$ cm$^{-3}$ if it is desired to use low programming voltages. Furthermore, it is desirable to limit Na to obtain satisfactory threshold voltages for n channel MOS transistors in other parts of the circuit. With an acceptor doping of about $5 \times 10^{16}$ cm$^{-3}$ for the corresponding part of the transistor area 4, a satisfactory punch-through voltage Vp (e.g. of about 4 volts) and a good injection probability can be obtained.

In the cell structure of FIGS. 2 to 5, if the same doping concentration Na over the thickness of the first region 1 were also to be present over the length between the region 1 and the transistor area 4, it would be necessary to separate laterally the injector region 2 from the transistor source and drain regions 5 and 6 by a significant distance to avoid lateral spread of the depletion layers 1', 5', 6' causing a punch-through connection between the injector region 2 and the source and drain regions 5 and 6. Thus, with Na of about $5 \times 10^{16}$ cm$^{-3}$ and a depth T of about 0.5 micrometers, this separation distance should be at least 2.5 micrometers. This would increase the size of the memory cell. However, in accordance with the present invention the lateral spread of the punch-through depletion layer is restricted by including one or more boundary regions 3 of the same conductivity type as the punch-through region 1 but with a higher doping concentration. FIG. 2 illustrates a transistor area 4 which is laterally separated from the punch-through first region 1 by one such boundary region 3. The transistor source and drain regions 5 and 6 are present in the area 4 (see FIGS. 3 to 5) but not in the drawing plane of FIG. 2. Compared with the deeper depletion layers in the punch-through region 1 and in the transistor area 4, only a very shallow depletion layer (with the surface inversion layer) extends at the surface of the higher-doped boundary region 3 between the region 1 and area 4. With this separating boundary region 3, the transistor regions 5 and 6 may be much closer to the injector region 2, for example at a lateral separation of about 1.25 micrometers and even less than about 0.7 micrometers, so that a more compact cell structure can be obtained.

Figure 3:
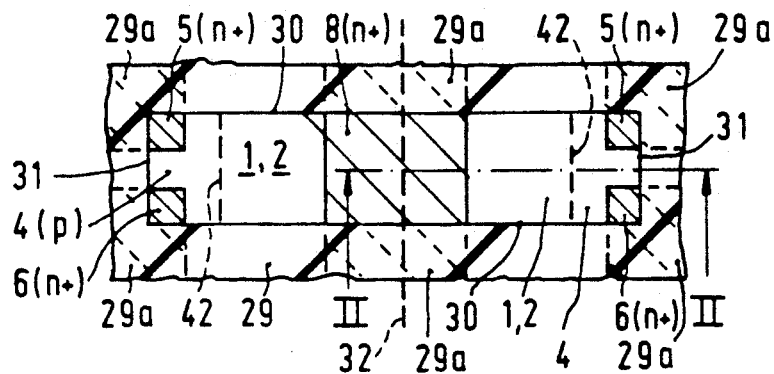
FIGS. 3 to 5 are plan views showing various regions of the structure of FIG. 2 for two adjacent memory cells.
Figure 4:
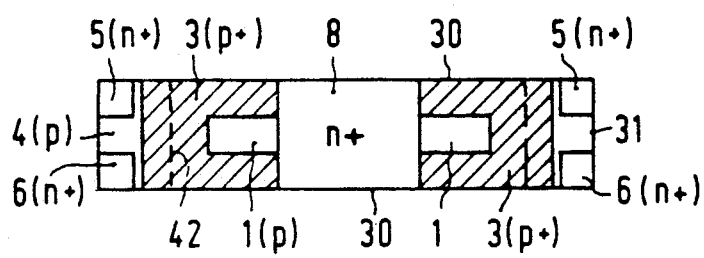

A boundary region 3 may also prevent parasitic connection of the injector region 2 to the body surface. Thus, it has been found that implanting an n type well to form the region 2 can result in an n type spur extending to the surface between the region 1 and area 4 (i.e. from the injector edge 42 illustrated in FIGS. 3 and 4) if the higher-doped boundary region 3 is not provided in this area (whereas it is so provided in this area as shown in FIG. 2). Furthermore, as illustrated in FIG. 3, each cell comprises in the body 10 an active island portion which includes the first region 1 and which is laterally bounded on at least two longitudinal sides by an inset insulating layer forming part of a field oxide pattern 29. Different parts of the field oxide pattern 29 around the island may be formed in different stages. Thus, for example, most of the pattern 29 may be inset by local oxidation of silicon (LOCOS) at an early stage in the manufacture, and at a later stage (e.g. after forming a shallow n type connection region pattern 8) other parts of the field oxide pattern 29 may be deposited, such as the parts 29a adjacent the source and drain regions 5 and 6 and injector connection region 8. Although not in cross-section in FIG. 3, the field pattern 29 has been hatched so as to facilitate visualization of the island structure; and as can be seen the island portions of two adjacent cells adjoin each other, in this particular embodiment at a common n type connection region 8. The island portions have two longitudinal sides 30 and an end side 31, and the structure is symmetrical about the plane 32. The n type injector region 2 of each cell extends from the common connection region 8 to below the punch-through region 1. The extent of the injector region 2 in the island portion is shown in FIG. 3, from which it can be seen that the region 2 extends between both longitudinal sides 30 and as far as 42. A parasitic n type connection of the injector region 2 to the body surface may occur at these sides 30 of the inset field pattern 29, and in order to prevent this the p type boundary region 3 is provided so as to adjoin the inset field pattern 29 on these two opposite sides 30.

Thus, in this case, each cell may comprise a U-shaped boundary region 3 (whose shape is shown by cross-hatching in FIG. 4) extending along the sides 30 and at the region edge 42, so as to extend laterally around the lower-doped punch-through region 1. In this manner a well-defined vertical punch-through region 1 is defined between the injector region 2 and a part of the floating-gate charge-storage region 11. Furthermore, the boundary region 3 extends across the island of each cell (at 42) to separate the island portion laterally into opposite first and second ends. The punch-through region 1 and underlying injector region 2 is present at the first end (adjacent connection region 8), below one part of the floating-gate charge-storage region 11. The transistor source and drain regions 5 and 6 are present at the second end (adjacent to side 31); another part of the floating-gate charge-storage region 11 extends above at least a channel area between the regions 5 and 6. This provides a particularly compact cell island structure with well-defined vertical punch-through. A compact layout for forming the connections to these source and drain regions 5 and 6 will be described later with reference to FIG. 6.

Figure 5:
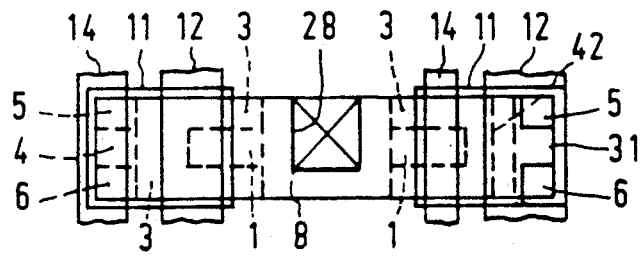

As illustrated in FIGS. 2 and 5, the control gate 12 and (in the case of an EEPROM) an erase gate 14 are provided on the second insulating layer 22 over the floating gate 11. The erase gate 14 has a smaller overlap area with the floating gate 11 than does the control gate 12, and so its capacitive coupling to the floating gate 11 is less than that of the control gate 12 to the floating gate 11. Erasure occurs by charge tunnelling from the floating gate 11 through the dielectric 22 to the erase gate 14. Both gates 12 and 14 may be formed by, for example, tracks of doped polycrystalline silicon which extend parallel to each other and transverse to the longitudinal sides 30 of the cell islands. Each of the cells in one column of a memory matrix may have a common control-gate track 12 and a common erase-gate track 14. A further insulating layer (not shown) covers the gate tracks 12 and 14. The regions 8 may be contacted at windows 28 in the insulating layer structure and may be connected together in rows by metal tracks 18 extending parallel to the longitudinal sides 30 of the cell islands.

In a typical example the inset field pattern may be, for example, 700 nm thick grown using LOCOS technology in a p type silicon body portion 10 having a boron doping of about $2 \times 10^{15}$ cm$^{-3}$. This body portion may be, for example an epitaxial layer of 3 to 5 micrometer thickness on a higher-doped p type substrate. The p type and n type wells may then be implanted using, for example, complementary masks so that the whole body surface is implanted either p type or n type. High energy boron and phosphorus implants may be used, able to penetrate the inset field pattern 29. For the p type well: about $1.2 \times 10^{12}$ cm$^{-2}$ of 210 keV boron ions and about $1.5 \times 10^{12}$ cm$^{-2}$ of 350 keV boron ions may be used to form the bulk of the p well (region 1 and transistor area 4), together with a threshold-adjusting implant of about $1.5 \times 10^{12}$ cm$^{-2}$ of 70 keV boron ions. For the n type well (including the injector 2): about $2 \times 10^{13}$ cm$^{-2}$ of 1 MeV phosphorus ions may be used, together with a threshold-adjusting implant of about $6 \times 10^{11}$ cm$^{-2}$ of 50 keV boron ions. As well as forming the regions 1,2 and 4 in the memory cell areas, these implanted n and p wells may be provided in other parts of the circuit device to implement CMOS circuitry, for example. In order to provide the boundary regions 3, an extra, localized boron implant is carried out, for example with about $5 \times 10^{12}$ cm$^{-2}$ of 150 keV boron ions, so that the boundary region 3 may be about 3 times more highly doped than the punch-through region 1 and about half the phosphorus dose of the n well implant so as to suppress n type connective spurs from the periphery of the injector region 2 to the surface. When using 1.25 micrometer process technology, for example, the width of the region 3 along the sides 30 may be about 1.25 micrometers so as to leave a width of about 1.25 micrometers for the punch-through region 1. The region 1 may be, for example, 0.5 micrometers deep. A gate oxide layer 21 of about 25 nm may be grown on the active areas of the cells. Shallow source and drain regions of the transistors can be formed by a low-energy implant in the active areas, together with shallow highly-doped contact regions such as a surface doping for the region 8.

The electrically-erasable memory cells of FIGS. 2 to 5 with a punch-through voltage Vp of 4 volts may be operated as follows: (1) for writing (programming), the substrate 10 (terminal E) and injector 2 (terminal A) are at 0 volts, the source and drain 5 and 6 (terminals S and D) and erase gate 14 (terminal C) are at e.g. 5 volts, and a programming pulse Vb of between 15 and 20 volts is applied to the control gate 12 (terminal B); (2) for erasing, the substrate 10 and injector 2 are at 0 volts, the control gate 12 and source and drain 5 and 6 may be at 0 volts but preferably are at e.g. 5 volts, and the erase gate 14 is raised to between 15 to 20 volts; (3) for reading, the transistor with source at 0 volts and drain at between 1 and 2 volts is used, the gates 12 and 14 being at e.g. 5 volts, while the injector 2 is kept at 0 volts. The application of the different voltages to the memory cell is effected with circuitry integrated in the memory. The respective couplings of the erase gate 14 and control gate 12 to the underlying floating gate 11 define the different charge-states of the floating gate 11 when respectively erased and programmed. The voltage Vd and the coupling of the control gate 12 sets the threshold voltage of the memory cell after programming. With the voltage Vb (of 15 to 20 volts) on the control gate 12, programming of the cell stops when the positive potential of the floating gate 11 has been decreased by the hot electron injection 18 to a level at which the transistor channel inversion layer is cut off. This is a well-defined level dependent on the threshold voltage. Erasure of the programmed state of the floating gate 11 is effected by electron tunnelling through the dielectric layer 22 to the erase gate 14 when this gate 14 is raised to a high positive potential. The thickness of the dielectric layer 22 and the degree of roughness of the surface of the polycrystalline silicon gate 14 can be chosen so that the same level of voltage (15 to 20 volts) is used on the erase gate 14 for erasure as on the control gate 12 for programming. The level of erasing can be controlled by an effective feed-back mechanism involving the injector 2. By biasing the source and drain 5 and 6 at 5 volts and the injector 2 at 0 volts (i.e. as in the programming mode) while keeping the control gate 12 at a low voltage (e.g. 5 V) and raising the erase gate 14 to the high voltage (15 to 20 volts), erasing will increase the floating gate voltage (by electron tunnelling). In this case, if the potential of the floating gate 11 starts to become too positive by over-erasure and turns the transistor on, the voltage levels on the other regions are such that hot-electron injection 18 starts in the punch-through region 1 from injector 2, and erase will stop. Thus, in this arrangement there is an advantageous feed-back mechanism to compensate against over-erasure, so that there is a well-defined end-state of gate 11 for the erasure. The threshold voltage difference (programming window) between an erased cell and a programmed cell is determined by the difference between the high voltage (15 to 20 volts) applied to the control gate 12 during programming and the low voltage (e.g. 5 volts) applied to control gate 12 during erasure. If a threshold voltage difference of only about 5 volts is desired, the low voltage may be about 13 volts when the high voltage is about 18 volts, for example.

Experimental results indicate a very efficient hot electron injection and transistor threshold voltage shift with this confined-vertical punch-through structure. Thus very high injection probabilities of about $10^{-4}$ can be obtained. Very high oxide currents of about 0.8 $A.cm^{-2}$ have been measured, and this implies very high programming speeds as the oxide is not destroyed.

Figure 6:
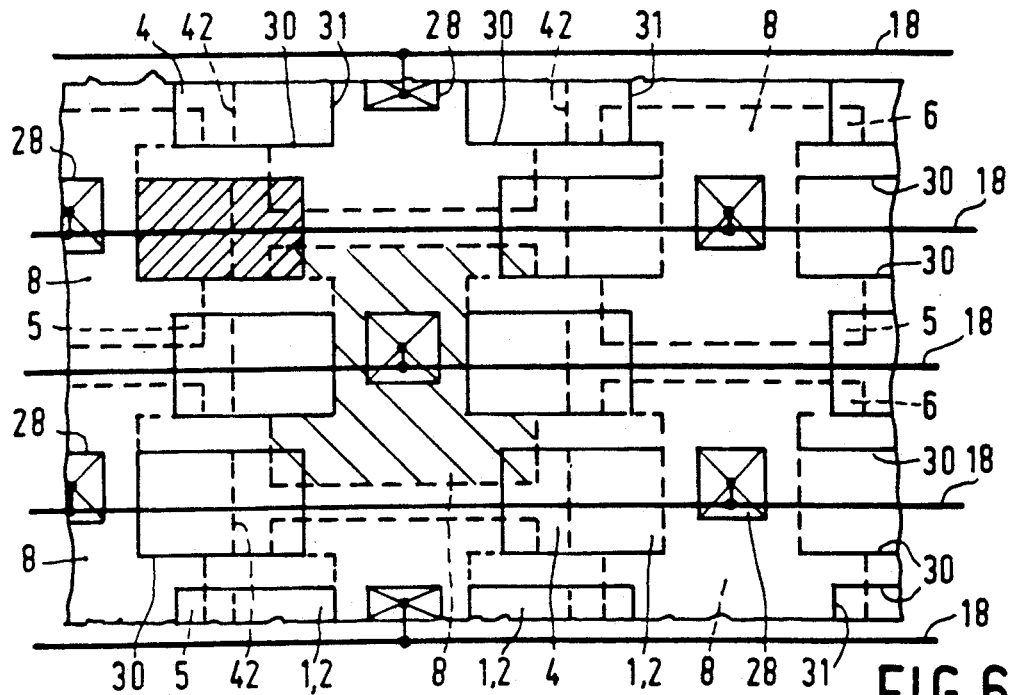
FIG. 6 is a plan view showing regions of several memory cells having a structure similar to that of FIGS. 2 to 5.

The present invention permits the design and operation of the memory cell with voltage levels of e.g. either 0 volts or 5 volts applied to injector regions 2 and transistor source and drain regions 5 and 6. Furthermore, the appropriate voltage levels for the various regions when programming, reading and erasing cells in adjacent rows and columns of a memory matrix in accordance with the invention are such that the cells can be organized in a compact layout as illustrated in FIG. 6. This layout avoids the need for separate contacts for connections S and D to the transistor source and drain regions 5 and 6. Thus, in accordance with the present invention, each n type connection region 8 forms a common connection for the injector regions 2 of two adjacent cells (e.g. in one island, as illustrated in FIGS. 2 to 5) and also extends into four other adjacent cell areas (island portions) to form in each of these four cells a source or drain region 5 or 6 of a transistor of that cell (or at least to form the connection to the source or drain 5 or 6 of that cell). To facilitate visualization of the layout, one such region 8 and one cell island-portion are each cross-hatched in FIG. 6. The parallel metal tracks 18 connecting rows of regions 8 (via windows 28) may form bit lines of the memory cell matrix. Word lines may be formed by the control-gate tracks 12 (not shown in FIG. 6) which extend perpendicular to the tracks 18. The state of a cell in one row may be read by controlling the voltages on the two neighboring bit lines, and these two neighboring bit lines are also used in programming and erasing that cell.

Figure 7:
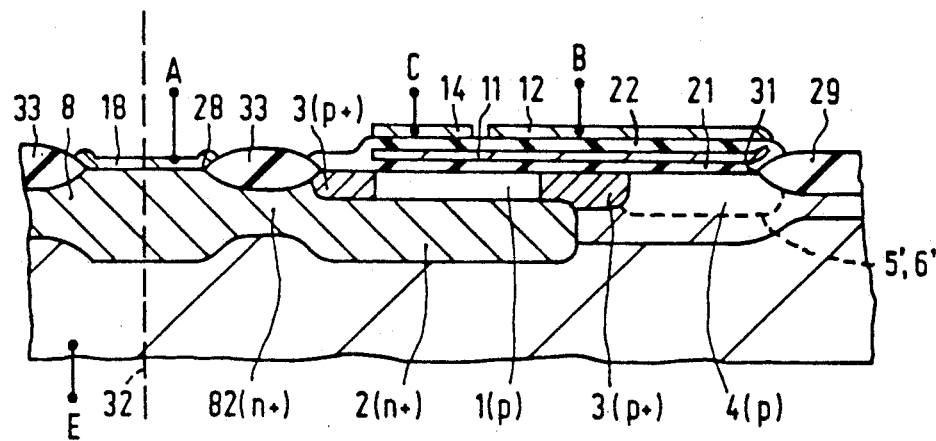
FIG. 7 is a cross-sectional view of another particular memory cell structure in accordance with the invention, illustrating a modification of that shown in FIG. 2.

From reading the foregoing disclosure it will be evident to a person skilled in the design of semiconductor memories and in semiconductor device technology that many modifications and variations are possible within the scope of the present invention. FIG. 7 illustrates a simple modification of the FIG. 2 structure, in which the injector region 2 comprises a buried layer 82 of the same conductivity type (n type) which extends below an intermediate part 33 of the inset field pattern 29. This part 33 extends across the island portion at the opposite end from the end 31. In this situation there is a risk that premature punch-through or some other connection of the injector region 2 to the inversion layer under the gate 11 may occur at the side of this inset part 33. Therefore, in accordance with the present invention, a (or the) boundary layer 3 of the same conductivity type as the punch-through region 1 but with a higher doping concentration adjoins this side of the inset part 33 above the buried layer 82.

Figure 8:
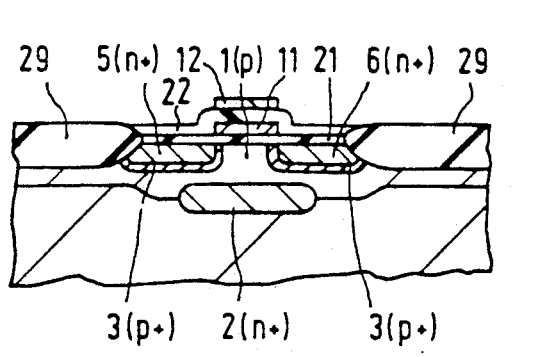
FIGS. 8, 9 and 10 are cross-sectional views (perpendicular to those of FIGS. 2 and 7) illustrating further modifications in a memory cell in accordance with the present invention.

In the embodiments of FIGS. 2 to 7, the transistor source and drain regions 5 and 6 are in an area 4 of the island which is laterally separated from the area containing the injector 2, by means of the boundary region 3 extending across the width of the island portion. FIG. 8 illustrates a modified structure, in which each cell comprises a transistor source and drain regions 5 and 6 which are each formed in a boundary region 3 of the higher doping concentration (p+). These regions 3 extend below the respective source and drain regions 5 and 6 and are separated from each other in the channel area of the transistor below the floating gate 11. In this construction, the injector 2 may be inserted closer to or even under the source and drain regions 5 and 6, so that a more compact memory cell can be obtained. These regions 3,5 and 6 may be formed by dopant implantation using the insulated gate 11 as a mask. An erase gate 14 may be coupled capacitively to the floating charge-storage region 11. Thus, for example, the erase gate 14 may be present on the insulating layer 22 over a part of the charge-storage region 11 outside the drawing plane of FIG. 8.

Figure 9:
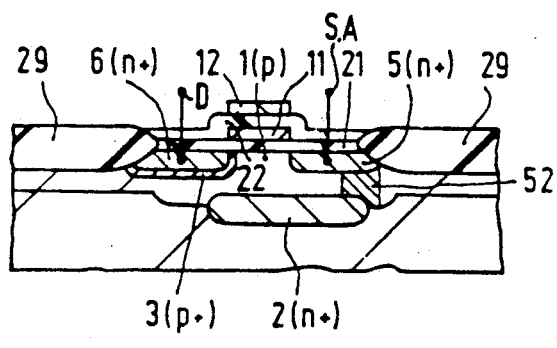

FIG. 9 illustrates a further modification in which the drain region 6 is formed in a boundary region 3 (as in FIG. 8), but the source region 5 is not. In this case, only the connection (at Vd) to the drain region 6 serves during programming to remove those hot electrons which are not injected into the insulating layer 21 and to bias the semiconductor surface below the gate structure. The source region 5 is present above part of the injector 2 and is connected to the injector 2 by a short-circuit region 52 of the same conductivity type, e.g. formed simultaneously with an n type well. In this case, a very compact cell structure can be obtained, but more current will flow during programming. Thus, during programming, a current will flow horizontally through the transistor due to the biasing of the drain 6 with respect to the injector 2 and source 5, coinciding with the vertical punch-through current. In the memory cell of FIG. 9, an erase gate 14 may be coupled capacitively to the floating charge-storage region 11. Thus, for example, the erasure gate 14 may be present on the insulating layer 22 over a part of the charge-storage region 11 outside the drawing plane of FIG. 9.

Figure 10:
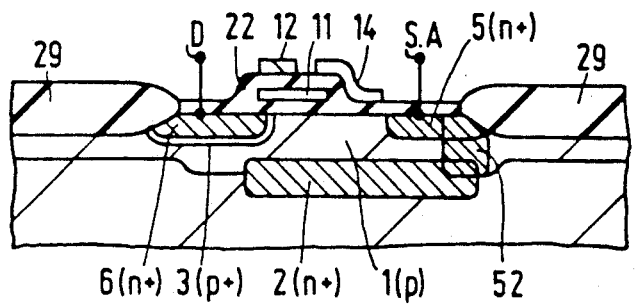

FIG. 10 illustrates a modification of the FIG. 9 structure, in which the floating charge-storage gate 11 extends over only a part (adjacent to the drain region 6) of the length of the transistor channel between the source and drain regions 5 and 6 and in which an insulated gate 14 extends (adjacent to the source region 5) over the remainder of the length of the transistor channel. By providing this arrangement of the gates 11 and 14, the transistor channel can be interrupted (below the gate 14) during programming so as to avoid the horizontal current flow between regions 5 and 6 which was described with reference to FIG. 9. This gate 14 may also be capacitively coupled to the floating gate 11 (as illustrated in FIG. 10) to form an erase gate of the memory cell. Thus, with the memory cell structure of FIG. 10 the following voltages are applied for the programming condition: control gate 12 at between 15 and 20 volts, injector 2 (and source region 5) and erase gate 14 at 0 volts, drain region 6 at between 4 and 10 volts (e.g. 5 volts). These voltages are the same voltages which are applied for programming in the other embodiments, except for the source region 5. The lateral spread of the depletion layer punching through to the injector 2 in the selected cell is restricted by the higher-doped boundary region 3 in which the drain region 6 is provided. Without the region 3, the drain 6 would need to be spaced further from the injector 2 and so more space would be required for the cell. Erasing can be effected in the same way as in the other embodiments, by bringing the erase gate 14 to between 15 and 25 volts, while the other terminals are at 0 volts. During programming, the non-selected cells experience the following conditions: either all terminals at 0 volts, or only the drain 6 at 4 to 10 volts, or only the control gate 12 at 15 to 25 volts. None of these conditions can program the cell. During reading, the source region 5 (and injector 2) is at 0 volts, the drain region 6 is at between 1 and 2 volts, and the gates 12 and 14 are at, for example, 5 volts; the voltage on the gate 14 induces a conductive inversion channel at the end of the transistor channel area adjacent the source region 5, while the charge-state of the floating gate 11 determines whether the transistor channel is interrupted or complete and so determines whether the transistor is ON or OFF.

It will be evident that other modifications and variations are possible in memory cells in accordance with the invention. Thus, in some devices, control gates 12 may have a lateral extension which overlies a part of the transistor channel area which is not overlaid by the floating gate 11. Although FIGS. 1 to 9 show control gates 12 on a second insulating layer 22 on the floating gate 11, control gates (and erasure gates) can be constructed in other ways, for example they may be in the body 10 as doped surface regions which form diodes capacitively coupled to the floating gate 11 via the insulating layer 21 at the body surface. An erase gate 14 may be present below a part of the floating gate 11.

Erasure may alternatively be carried out without a special gate 14, for example by charge-carrier transport through the gate oxide 21 to the source and drain regions 5 and 6 or through a thin oxide layer elsewhere. Instead of using a floating gate as the charge-storage region 11, charge traps at the interface of two insulating layers 22 and 21 (for example silicon nitride on silicon dioxide) may be used to form the charge-storage region 11, although this is much less efficient in collecting injected hot electrons. Instead of the source and drain of the transistor being n type regions, Schottky electrodes may be used.

Although FIGS. 1 to 10 illustrate hot electron injection, hot hole injection is also possible using the vertical punch-through injection arrangement with an n type punch-through region 1 over a p type injector region 2, and with higher-doped (n+) n type boundary regions 3 and with p type source and drain regions 5 and 6. However the injection efficiency for hot holes is several orders of magnitude less than that for hot electrons.

From reading the present disclosure, other variations will be apparent to persons skilled in the art. Such variations may involve other features which are already known in the design, manufacture and use of semiconductor memories, memory device structures, semiconductor circuits, and their manufacturing technology, and which may be used instead of or in addition to features already described herein.

We claim:

1. An electrically-programmable semiconductor memory comprising a plurality of memory cells, each cell having a field-effect transistor with a charge-storage region whose charge state defines a memory state of the cell, the memory comprising a semiconductor body having for each cell a first insulating layer portion at a surface of the body over a first region of the body of a first conductivity type, the charge-storage region extending at a surface of the first insulating layer portion, programming means for each cell comprising an injector region of an opposite second conductivity type forming a p-n junction with the first region, and a control gate capacitively coupled to the charge-storgage region, characterized in that the injector region is located within the body below the first region below the charge-storage region, in that the control gate, the injector region and at least a drain of the transistor of each cell are provided with connection means for applying programming voltages to a cell to bias the control gate and the surface of the first region with respect to the injector region so as to set a desired charge-state of the charge-storage region of that cell by injection of hot charge-carriers through the first insulating layer portion vertically from the injector region, the first region having a sufficiently low doping concentration of the first conductivity type above the injector region to allow punch-through via a depletion layer vertically across the thickness of the first region to the injector region upon application of the programming voltages, in that hot charge carriers not injected into the first insulating layer portion are removed via the connection means to the drain of the transistor of that cell during the programming of that cell, and in that means are provided for restricting the lateral spread of the depletion layer at at least one side of the first region of each cell down to the injector region during punch-through vertically across the thickness of the first region, said means comprising at least one boundary region having a higher doping concentration of the first conductivity type than that of said first region, said boundary region being located at said at least one side of the first region of each cell.

2. A memory as claimed in claim 1, further characterized in that the boundary region is present above a peripheral part of the injector region to prevent parasitic connection of the injector region to the surface.

3. A memory as claimed in claim 2, further characterized in that each cell comprises in the body an island portion which includes the first region and which is bounded by an inset field insulating layer pattern at the surface of the body, and in that the boundary region adjoins the inset field pattern on at least one side of the island portion.

4. A memory as claimed in claim 3, further characterized in that the injector region extends below the first region between two opposite sides of the island portion, and in that the boundary region adjoins said two opposite sides.

5. A memory as claimed in claim 3, further characterized in that the connection means to the injector region comprises a buried layer of the second conductivity type which extends below an intermediate part of the field pattern, and in that the boundary region adjoins a side of this intermediate part.

6. A memory as claimed in claim 1, further characterized in that the transistor of each cell comprises source and drain regions present in an area of the body which is laterally separated from the first region by the boundary region.

7. A memory as claimed in claim 6 further characterized in that each cell comprises in the body an island portion across which the boundary region extends to separate the island portion laterally into opposite first and second ends, the first region and underlying injector region being present at the first end below one part of the charge-storage region, another part of the charge-storage region extending above at least a channel area between the transistor source and drain present at the second end.

8. A memory as claimed in claim 1 further characterized in that the transistor of each cell comprises source and drain regions of the second conductivity type which are each formed in a boundary region of the higher doping concentration of the first conductivity type, which boundary regions extend below the respective source and drain region and are separated from each other in a channel area of the transistor below the charge-storage region.

9. A memory as claimed in claim 1 further characterized in that the transistor of each cell comprises a drain region of a second conductivity type in the boundary region of high doping concentration of the first conductivity type, and the transistor also comprises a source region of the second conductivity type connected to the injector region.

10. A memory as claimed in claim 9, further characterized in that the charge-storage region extends over only a part of the length of the transistor channel between the source and drain regions, and in that an insulated gate extends over the remainder of the length of the transistor channel.

11. A memory as claimed in claim 10, further characterized in that said insulated gate is also capacitively coupled to the charge-storage region to provide an erase gate of the memory cell.

12. A memory as claimed in claim 1 further characterized in that each cell comprises an island portion of the body, and in that the island portions of two adjacent cells adjoin each other at a connection region of the second conductivity type which forms a common connection to the injector regions of the two adjacent cells.

13. A memory as claimed in claim 12, further characterized in that the connection region of the second conductivity type extends into four other adjacent island portions, in addition to said two adjacent island portions, to form a source and drain connection of the transistor in each of said four island portions.

14. A memory as claimed in claim 1 further characterized in that the control gate is present on a second insulating layer portion over the charge-storage region, and in that the charge-storage region is a floating gate between the first and second insulating layer portions.

15. A memory as claimed in claim 14, further characterized in that each memory cell comprises an erase gate which is present on the second insulating layer over the charge-storage region to permit electrical erasure of the memory state of that cell by applying an erasure voltage to the erase gate.

16. A memory as claimed in claim 1 further characterized by each memory cell comprising an erase gate coupled to the charge-storage means, and connection means for applying an erasure voltage to the erase gate to permit electrical erasure of the programmed charge-state of that cell while biasing the control gate at a lower voltage and while biasing the surface of the first region and the injector region at programming voltages to permit hot carrier injection into the charge-storage region from the injector region to compensate against over-erasure of the memory state.

17. A memory as claimed in claim 1 further characterized in that the injector region comprises an implanted n type well in a p type portion of the body, and in that a shallower implanted p type well is formed in a laterally adjacent part of the p type portion and overlaps and overdopes part of the area of the n type well to form the first region above the injector region.

18. An electrically-programmable semiconductor memory comprising a plurality of memory cells, each cell having a field-effect transistor with a charge-storage region whose charge state defines a memory state of the cell, the memory comprising a semiconductor body having for each cell a first insulating layer portion at a surface of the body over a first region of the body of a first conductivity type, the charge-storage region extending at a surface of the first insulating layer portion, programming means for each cell comprising an injector region of the opposite second conductivity type forming a p-n junction with the first region, and a control gate capacitively coupled to the charge-storage region, characterized in that the injector region is located within the body below the first region below the charge-storage region, in that the control gate, the injector region and at least a drain of the transistor of each cell are provided with connection means for applying programming voltages to a cell to bias the control gate and the surface of the first region with respect to the injector region so as to set a desired charge-state of the charge-storage region of that cell by injection of hot charge-carriers through the first insulating layer portion vertically from the injector region, the first region having a sufficiently low doping concentration of the first conductivity type above the injector region to allow punch-through via a depletion layer vertically across the thickness of the first region to the injector region upon application of the programming voltages, and in that hot charge carriers not injected into the first insulating layer portion are removed via the connection means to the drain of the transistor of that cell during the programming of that cell, further characterized by each memory cell comprising an erase gate coupled to the charge-storage means, and connection means for applying an erasure voltage to the erase gate to permit electrical erasure of the programmed charge-state of that cell while biasing the control gate at a lower voltage and while biasing the surface of the first region and the injector region at programming voltages to permit hot carrier injection into the charge-storage region from the injector region to compensate against over-erasure of the memory state.

19. A memory as claimed in claim 18, further characterized in that the injector region comprises an implanted n type well in a p type portion of the body, and in that a shallower implanted p type well is formed in a laterally adjacent part of the p type portion and overlaps and overdopes part of the area of the n type well to form the first region above the injector region.

* * * * *